United States Patent [19]

Gordon

[11] Patent Number: 4,535,000

[45] Date of Patent: Aug. 13, 1985

[54] CHEMICAL VAPOR DEPOSITION OF TITANIUM NITRIDE AND LIKE FILMS

[76] Inventor: Roy G. Gordon, 22 Highland St., Cambridge, Mass. 02138

[21] Appl. No.: 546,471

[22] Filed: Oct. 28, 1983

Related U.S. Application Data

[63] Continuation-in-part of Ser. No. 443,340, Nov. 22, 1982, abandoned.

[51] Int. Cl.³ ............................ B05B 5/00; B05D 5/00
[52] U.S. Cl. .................................... 427/160; 427/166; 427/255.2; 65/60.1
[58] Field of Search ................ 427/160, 162, 164, 166, 427/109, 255, 255.2; 350/1.1, 165; 65/60.51, 60.7, 60.1

[56] References Cited

U.S. PATENT DOCUMENTS 3,885,855 5/1975 Gross .............................. 428/427 X
4,101,703 7/1978 Schintlmeister .................... 428/216

FOREIGN PATENT DOCUMENTS 773702 5/1957 United Kingdom ............. 427/255.2

*Primary Examiner*—Norman Morgenstern
*Assistant Examiner*—Ken Jaconetty
*Attorney, Agent, or Firm*—Andrew F. Kehoe

[57] ABSTRACT

A novel process for placing a thin film of a metal nitride, e.g. titanium nitride, on a glass substrate by mixing a metal halide with a reducing gas like ammonia, preferably within a range of from about 250° C. to 320° C., and then reacting the gases at the surface of a glass substrate heated to, e.g., about 400° C. to about 700° C. to form the film on the glass.

16 Claims, 1 Drawing Figure

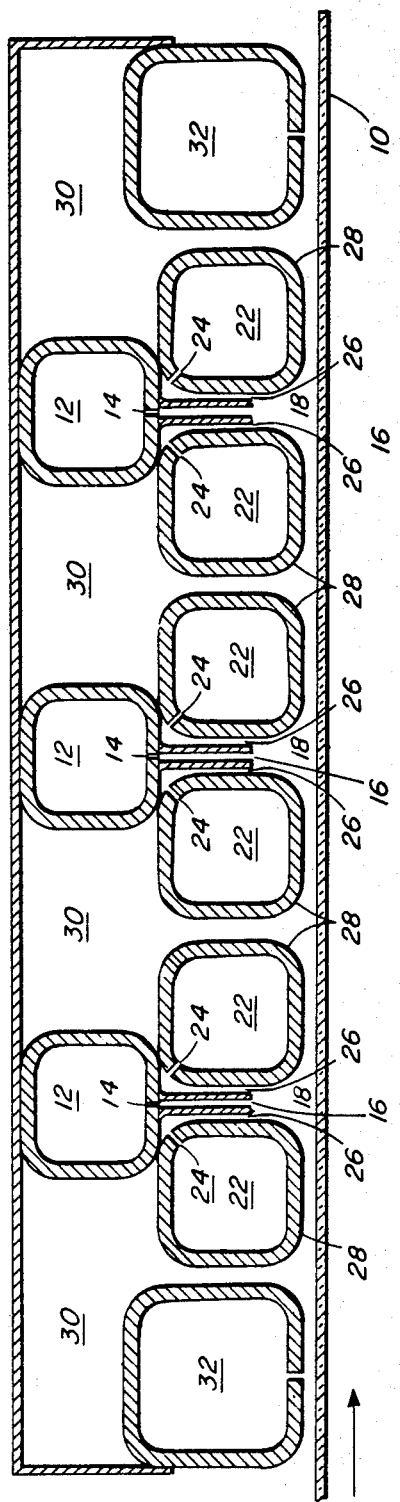

CHEMICAL VAPOR DEPOSITION OF TITANIUM NITRIDE AND LIKE FILMS

RELATED APPLICATION

This application is a continuation-in-part of U.S. patent application Ser. No. 443,340 filed Nov. 22, 1982 by Roy G. Gordon and now abandoned.

BACKGROUND OF THE INVENTION

Control of the solar energy coming into windows is important in maintaining comfortable indoor conditions in warm climates. Window materials have been developed also to reduce glare. Solar control has been achieved commonly by adding absorbing colorant material to the glass. Tinting of glass in this way has disadvantages in production, however, since a long time may be required to change shades. More recently, reflecting and absorbing films have been applied to clear glass, to achieve solar control. Reflection of unwanted radiation is more efficient than absorption, since reflection eliminates the radiation completely, whereas part of the absorbed heat is eventually carried into the building.

Processes for the application of reflective and absorptive solar control films are well-known in the area of glassmaking. For example, films of metals such as chromium or nickel are evaporated or sputtered onto glass in vacuum, using equipment which is commercially available and well-known in the art. While good quality reflective and absorptive films are produced by vacuum methods, the cost can be rather high. Mixtures of metal oxides, such as chromium oxide, cobalt oxide and iron oxide, can be deposited by spray pyrolysis, as described for example in U.S. Pat. No. 3,652,246. Similar films have been made by chemical vapor deposition, as described for example in U.S. Pat. No. 3,850,679 and by pyrolysis of finely powdered materials as described in U.S. Pat. No. 4,325,988. These films are not as reflective as the vacuum-deposited metals, but they can be produced more cheaply. They do require materials such as cobalt and chromium, which have limited sources of supply, and must be imported into the U.S. Also, chromium and nickel are suspected of causing cancer, so the safety of such coated products for widespread use may be questioned.

It has also been proposed in U.S. Pat. No. 3,885,855 to produce solar control films by reactive sputtering of the nitrides, carbides or borides of the metals titanium, zirconium, hafnium, vanadium, niobium, tantalum, chromium, molybdenum, or tungsten. While effective optical properties were known for some of these materials, any largescale production of architectural glass by the vacuum electrical method of reactive sputtering would be rather expensive.

The machine tool industry has utilized hard, relatively thick, opaque, wear-resistant coatings of titanium nitride. These coatings are formed at very high temperatures, say 1000° C., with a nitrogen, hydrogen and titanium tetrachloride reaction mixture. However, Japanese Pat. No. 74-83679 and Swedish Pat. No. 397,370 have disclosed such wear-resistant coatings, all of which are functionally opaque and at least about three microns thick, to have been formed from the reaction of ammonia and titanium tetrachloride at temperatures in the 550° C. range.

U.S. Pat. No. 4,310,567 describes formation of nitride coating, but no process is disclosed which is capable of providing thin transparent films for solar applications.

U.S. Pat. No. 4,196,233 to Bitzer also describes a nitride coating process.

SUMMARY OF THE INVENTION

It is one object of the invention to provide a process for a very fast deposition of solar control coatings on glass by chemical vapor deposition from a reactive vapor mixture onto the surface of hot glass.

Another object is to deposit a solar control film rapidly in a continuous process including a process suitable for incorporation into a float glass line if such incorporation is desired.

A further object is to carry out this deposition process with simple and inexpensive equipment operating at atmospheric pressure, without the need for complex and expensive vacuum and electrical equipment.

Still another object is to achieve the above goals with the use of inexpensive and abundant raw materials, without the need for any rare, imported or expensive raw materials.

A particular object of the invention is to utilize the volatile nature and reactivity of a certain titaniumm chloride by developing a reaction with ammonia which permits high-speed formation of titanium-nitride film on a glass substrate.

Another object of the invention is to provide a superior solar control film.

Other objects of the invention will be obvious to those skilled in the art on reading the instant invention.

The invention utilizes a reaction between a metal-bearing compound like titanium tetrachloride and a reducing gas like ammonia. Each of the metal-bearing compound and the reducing gas are contained in a hot inert carrier gas, and reacted in immediate proximity to a hotter glass surface. When the temperature of the glass surface is above 400° C., Preferably at temperatures of about 600° C. or above deposition rates are fastest and quality is optimum. Of course, many glass substrates will soften and have practical procesing limit of about 700° C. Borosilicate glass appears to be a particularly desirable substrate for forming the products of the invention. A preferred combination of reactants, titanium tetrachloride and ammonia, react rapidly to form a strongly adherent film whose composition is primarily titanium nitride, TiN, with some chlorine also included in the film. The deposition atmosphere should be kept free of oxygen and water vapor, or the deposited film will consist primarily of titanium oxide, rather than the desired titanium nitride. Very small amounts of oxygen and moisture seem to be tolerated where an excess of ammonia is used. While titanium dioxide does increase the reflection from the glass surface, it does not absorb light nearly as much as titanium nitride does.

The films are smooth and mirror-like, and free of haze. Thin films, e.g. those of about 200 angstroms, are silvery in reflected color, while thicker films are golden, pale blue, gray, black, reddish or brown in color as the thickness builds towards 0.1 microns. The transmitted colors are neutral, gray, light yellow, pale green, pale blue or brown.

The mechanical properties of the films are good. Abrasion and scratch-resistance are comparable or better than commercially available solar control films on glass. The chemical resistance of the films is excellent, and they resist water, soaps, bases and acids, except for hydrofluoric acid, which etches both the films and the glass.

The titanium nitride films also conduct electricity. This property permits uses other than as a solar control film. It may be used as part of an electrical circuit to detect broken windows, e.g. as in burglar alarm system.

IN THE DRAWING

The drawing is a cross section of apparatus suitable for carrying out the coating process.

The new process takes advantage of the discovery that careful temperature control of the reaction between the metal-bearing halogen reactant and the reducing gas will achieve a film-forming reactant and will avoid the formation of powder, the normal addition product of such a reaction. Powder formation is avoided, most importantly, even in very small quantities that would impart an undesirable haze to the transparent glass substrate. The process may be facilitated by the use of a very large excess of reducing gas to minimize the amount of halogen left within the coating. Any quantities of oxygen and halogen that remain have no deleterious effect on the properties of the coating. Indeed, small quantities of the halogen can aid color control and electrical properties of the film where desired. For example, in films thick enough to have color dominated by bulk properties of the film, increasing halogen tends to change the color from golden to red to black.

Since titanium tetrachloride and ammonia react at room temperature to form solid addition compounds, these reactants must be mixed in the immediate vicinity of the hot glass surface which is to be coated. The temperature of the gases at the point of mixing should be above 200° C. but below about 400° C. If the temperature of mixing is too low, some of the solid addition compound may cover or may cover or clog the coating apparatus. On the other hand, mixing the gases at too high a temperature, about 500° C. or above, tends to result in powdered titanium nitride product and/or film on the apparatus rather than the desired adherent film on the glass. The preferred temperatures of mixing range from about 250° C. to 320° C.

Apparatus for doing the mixing and coating is shown schematically and in section in FIG. 1. A ribbon of hot glass 10 moves transversely on rollers (not shown), as in the cooling lehr during the manufacturing of glass. Titanium tetrachloride vapor mixed with a carrier gas such as nitrogen enters the distribution ducts 12 which cross the width of the hot glass ribbon 10. The titanium tetrachloride vapor mixture then passes through flow constrictions 14 into a narrow distribution slot 16, and then into the mixing zone 18. The ammonia, also diluted in an inert carrier gas such as nitrogen, enters distribution ducts 22, passes through constrictions 24 and distribution slots 26 to the mixing zone 18. The flow constrictions 14 and 24 are uniformly spaced across the width of the glass ribbon, so as to provide uniform distribution of the gaseous reactants, and uniform thickness of the coating. Layers 28 are thermal insulation whose thickness is chosen so that the temperature of the gases in the distribution slots 16 and 26 is held in the desired range.

The mixed gases in zone 18 flow over the surface of the hot glass 10 and into the exhaust ducts 30. During the course of this flow, the titanium nitride film is deposited on the surface of the hot glass. Several coating stages may be placed side-by-side, in order to build up the desired film thickness during a single passage of the glass ribbon under the series of coaters. In fact, the use of multiple coaters promotes uniform coating, since non-uniformities of one coater will not usually match those of the others, and there will tend to be some cancellation of thickness errors from the different coaters.

Air and water vapor must be excluded from the deposition region, so a flow of dry inert gas, such as nitrogen, is provided through ducts 32 on all four sides of the coaters.

The coaters may also be inverted and positioned below the glass. The advantage to having the coaters positioned below the glass is that any built-up coating or powder byproduct remains on the coater surface, and there is no chance for such material to reach the surface of the glass, and thereby mar the uniformity of the coating. Thus, the time between cleaning of the coaters can be longer when the coaters are placed below the glass, than when they are placed above.

The coaters are exposed to corrosive gases, including the reactant titanium tetrachloride and by-product hydrogen chloride. Thus, the coaters should be constructed from corrosion-resistant materials. Nickel and certain nickel-based alloys containing nickel, chromium, molybdenum and tungsten (for example, Hastelloy C, trademark of Cabot Corporation) are particularly suitable materials of construction.

The concentration and flow rates of the reactant vapors may be chosen so that a large stoichiometric excess of ammonia is present. Otherwise, larger amounts of chlorine may be retained in the coating. For example, between 5 and 50 moles of ammonia may be used for each mole of titanium tetrachloride. Typical concentrations of the mixed gases range from 0.1 to 0.5 mole percent titanium tetrachloride and 1 to 5 percent ammonia. Lower concentrations result in lower coating rates, while higher concentrations may result in excessive powder formation.

Another feature is to mix in close proximity to the glass on which the coating is to be deposited. The procedures described in U.S. Pat. No. 3,979,500 are avoided in order to achieve the desired film formation without haze or powder.

The temperature of the glass is typically from 400° C. to 700° C. when the coating is applied. Lower temperatures result in excessively slow reaction rates, while higher temperatures may produce powder or rough, hazy coatings. The preferred temperature range is about 500° to 650° C.

Products formed by the invention are of particular value in solar-control operations wherein light transmission in the range of 1 to 40% is usually desired. This is orders of magnitude above any non-sensible light which may have been transmitted through the earlier wear-resistant coatings used on cemented carbides and other machine stock.

ILLUSTRATIVE EXAMPLE OF INVENTION

In this application and accompanying drawing there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

EXAMPLE 1

Borosilicate glass, heated to about 590°, is moved at a rate of 20 cm/sec under a sequence of three coaters as shown in FIG. 1. Each coater is supplied with a mixture containing 0.4 mole percent titanium tetrachloride vapor in nitrogen, through ducts 12, and a mixture of 4 mole percent ammonia gas in nitrogen, through ducts 22. The total flow rate of all gases going into each coater is about 250 liters per minute, per meter of glass width coated.

The inlet slots 16 and 26 of each coater end about 3 centimeters above the surface of the glass being coated.

The coated glass is brown in color, in transmission, and has a visible light transmission of about 10%. The coating has an electrical conductivity of about 100 ohms per square. It has excellent infrared reflectivity and is about 600 angstroms thick.

EXAMPLE 2

The process of claim 1 was repeated using concentrations of 0.5% titanium tetrachloride and 0.5% ammonia. The film was deposited with a four second exposure of the borosilicate glass (pyrex glass) substrate which was heated to 600° C. A film allowing only 20% transmission of total solar radiation was formed.

It should be noted that zirconium, hafnium, vanadium, niobium, tantalum, chromium, molybdenum, tungsten, or their mixtures may be substituted for the titanium in the process of the invention. However, these metals are more expensive and less abundant than titanium. Thus, titanium nitride is preferred to the nitrides of zirconium, hafnium, vanadium niobium, tantalum, chromium, molybdenum, or tungsten. Bromides or iodides may be used in place of the chlorides to transport these metals, but the greater cost and lower volatility of the bromides and iodides, makes the chlorides preferred in this process.

Carbides and borides of the metals noted above, can be used in place of the nitrides. Some carbides require higher reaction temperatures for their formation by known chemical vapor deposition processes, and such higher temperatures make these carbide depositions incompatible with normal glass processing. The metal borides can be formed by chemical vapor deposition at temperatures suitable for glass processing, but preferred and highly reactive sources of boron, such as diborane gas are expensive. Therefore, the nitrides are preferred to the carbides and borides.

In the case of all of the compounds mentioned in the preceding two paragraphs, the mixing temperature must be maintained below the reaction temperature, the mixing should be carried out just before the gas is placed in proximity to a hot glass surface, and the temperature of the glass must be sufficiently high to cause formation of the desired inorganic product just as the deposition takes place.

The glass coating films of the invention have particularly desirable properties and may be used to block out more solar radiation than visible light. For example, a film thick enough to block out 85% of the total solar radiation blocks out only 75% of visible light. This contrasts with the fact that most solar control films now produced will block less than 75% of total solar radiation if they are thin enough to block only 75% of visible light.

Moreover, the titanium nitride films of the invention have an emissivity below 0.3 and typically between 0.1 and 0.2, in the thermal infra-red range of wavelengths, e.g. around 10 microns. Thus they have better thermal insulation characteristics when utilized as architectural glass in windows of air-conditioned buildings in which their primary purpose would be to reduce solar radiation entering the window. This emissivity of below about 0.2 is to be compared to emissivities of presently available solar control films. These range typically from 0.5 to 0.9.

Such films, deposited according to the present process, have not only the above advantages, but have abrasion resistance better than commerical solar control films of the types based on chromium, silicon, or of mixed oxides of cobalt, chromium and iron.

It is also to be understood tha the following claims are intended to cover all of the generic and specific features of the invention herein described and all statements of the scope of the invention which might be said to fall therebetween.

What is claimed is:

1. A process for depositing a transparent, solar control film composed mainly of titanium nitride on a transparent heated glass ribbon substrate, by the steps of
   (a) preparing a first preheated gaseous mixture of titanium tetrahalide vapor reactant in an inert carrier gas,
   (b) preparing a second preheated gaseous mixture of ammonia reactant, as a nitrogen donor and a reducing gas, and inert carrier gas,
   said first and second gaseous mixtures containing at least 0.1 mole percent of said tetrahalide based on the gas in both mixtures and,
   (c) mixing the two said gas mixtures at a temperature below 500° C. in the immediate proximity of said substrate which is at a temperature of at least about 500° C. such that a substantially haze free film is formed on by reaction products of said reactants on said glass substrate.

2. A process as defined in claim 1 wherein said tetrahalide is tetrachloride.

3. A process as in claim 1, in which the preheating of said tetrahalide and said ammonia is within the range of about 200° C. to about 400° C.

4. A process as in claim 2, wherein 1 to 50 moles of ammonia are mixed with every mole of titanium tetrachloride.

5. A process as in claim 1, wherein said titanium tetrahalide is titanium tetrabromide or titanium tetraiodide.

6. A process as in claim 3, wherein said titanium tetrahalide is titanium tetrabromide or titanium tetraiodide.

7. A process as in claim 2, in which the final mixing of said tetrachloride and said ammonia takes place at a temperature within the range of about 200° C. to about 400° C.

8. A process as defined in claim 3 wherein said mixing of said first and second gas mixtures takes place with said gas mixtures preheated to within a temperature range of from about 250° C. to 320° C.

9. A process as in claim 8, wherein the substrate is heated to a temperature of above 500° C.

10. A process for depositing a solar control film of titanium nitride on a transparent, heated glass ribbon substrate, said process including the steps of
    (a) preparing a gaseous mixture of titanium tetrahalide vapor reactant and an inert carrier gas, (b) preparing a second gas mixture of ammonia reactant, as a nitrogen donor and a reducing gas, and an inert carrier gas, (c) mixing said gas mixtures at a temperature range of from about 200° C. to 400° C. to provide a reaction product; and (d) depositing said reaction product on a said transparent, heated glass substrate.

11. A process as in claim 10, wherein the substrate is heated to a temperature of above 500° C.

12. A process as in claim 10, wherein said titanium tetrahalide is titanium tetrabromide or titanium tetraiodide.

13. A process as defined in claim 10 wherein said tetrahalide is tetrachloride.

14. A process as defined in claim 10 wherein said mixing of said first and second gas mixtures takes place with said gas mixtures preheated to within a temperature range of from about 250° C. to 320° C.

15. A process as defined in claim 13 wherein said mixing of said first and second gas mixtures takes place with said gas mixtures preheated to within a temperature range of from about 250° C. to 320° C.

16. A process as defined in claim 11 wherein said mixing of said first and second gas mixtures takes place with said gas mixtures preheated to within a temperature range of from about 250° C. to 320° C.

* * * * *